US010261386B2

(12) United States Patent
Wang et al.

(10) Patent No.: US 10,261,386 B2
(45) Date of Patent: Apr. 16, 2019

(54) DISPLAY DEVICE AND DISPLAY TERMINAL

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Qian Wang, Beijing (CN); Xue Dong, Beijing (CN); Xiaochuan Chen, Beijing (CN); Wenqing Zhao, Beijing (CN); Ming Yang, Beijing (CN); Pengcheng Lu, Beijing (CN); Jian Gao, Beijing (CN); Xiaochen Niu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 4 days.

(21) Appl. No.: 15/548,042

(22) PCT Filed: Jan. 3, 2017

(86) PCT No.: PCT/CN2017/000043
§ 371 (c)(1),
(2) Date: Aug. 1, 2017

(87) PCT Pub. No.: WO2017/185813
PCT Pub. Date: Nov. 2, 2017

(65) Prior Publication Data
US 2018/0129113 A1 May 10, 2018
US 2018/0348591 A9 Dec. 6, 2018

(30) Foreign Application Priority Data

Apr. 27, 2016 (CN) .................... 2016 2 0373112 U

(51) Int. Cl.
*G02F 1/1335* (2006.01)
*G02F 1/29* (2006.01)
(Continued)

(52) U.S. Cl.
CPC .......... *G02F 1/29* (2013.01); *G02F 1/133528* (2013.01); *G02F 1/133602* (2013.01);
(Continued)

(58) Field of Classification Search
CPC ......................................... G02F 2001/134372
See application file for complete search history.

(56) References Cited

U.S. PATENT DOCUMENTS 6,075,581 A * 6/2000 Shirochi ........... G02F 1/133504
348/833
2007/0247566 A1* 10/2007 Choo ................... G02B 5/3058
349/96
(Continued)

FOREIGN PATENT DOCUMENTS

CN 102109101 A 6/2011
CN 104090443 A 10/2014
(Continued)

OTHER PUBLICATIONS

PCT (CN) International Search Report, Application No. PCT/CN2017/000043, dated Apr. 11, 2017, 5 pps.
(Continued)

*Primary Examiner* — Phu Vu
(74) *Attorney, Agent, or Firm* — Armstrong Teasdale LLP

(57) ABSTRACT

Provided in the embodiments of the present disclosure are a display device and a display terminal. The display device includes a light emitting panel and at least one optical modulation unit provided on a light exit side of the light emitting panel, a grating layer being provided in the light emitting panel, or between the light emitting panel and the
(Continued)

optical modulation unit, wherein the optical modulation unit is configured to modulate incident light to exit at a certain preset angle, and the grating layer is configured to parallelize exit directions of incident light.

20 Claims, 5 Drawing Sheets

(51) Int. Cl.
    *H01L 27/32*     (2006.01)
    *H01L 51/52*     (2006.01)

(52) U.S. Cl.
    CPC ...... *H01L 27/3232* (2013.01); *H01L 51/5262* (2013.01); *H01L 51/5281* (2013.01); *G02F 2001/133548* (2013.01); *G02F 2201/305* (2013.01); *G02F 2201/44* (2013.01); *H01L 27/3244* (2013.01); *H01L 2251/5307* (2013.01); *H01L 2251/5315* (2013.01)

(56) References Cited

U.S. PATENT DOCUMENTS

| | | |
|---|---|---|
| 2008/0001849 A1 | 1/2008 | Jin et al. |
| 2013/0016312 A1 | 1/2013 | Kim et al. |

FOREIGN PATENT DOCUMENTS

| | | |
|---|---|---|
| CN | 104570469 A | 4/2015 |
| CN | 205281069 U | 6/2016 |
| CN | 205542789 U | 8/2016 |

OTHER PUBLICATIONS

PCT (CN) Written Opinion, Application No. PCT/CN2017/000043, dated Apr. 11, 2017, 12 pps.: with English translation.

* cited by examiner

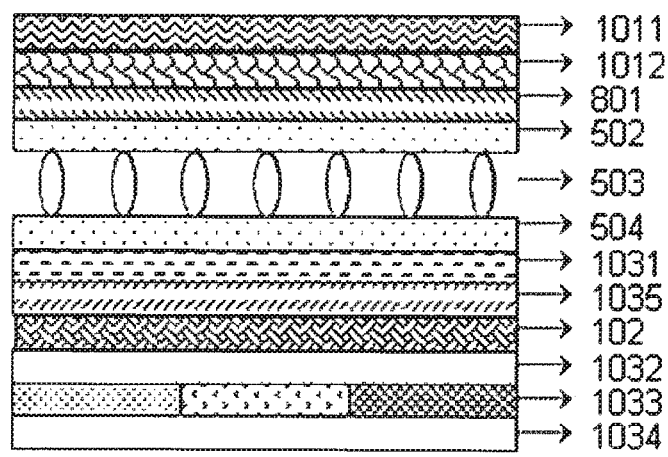
Fig. 8
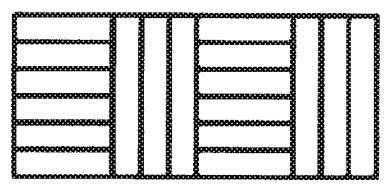 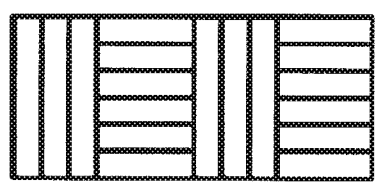
Fig. 9A			Fig. 9B
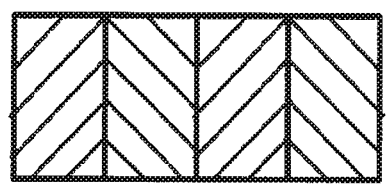 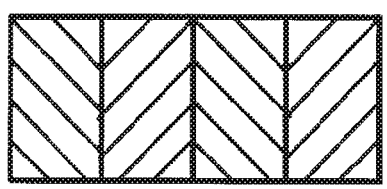
Fig. 9C			Fig. 9D

DISPLAY DEVICE AND DISPLAY TERMINAL

CROSS REFERENCE TO RELATED APPLICATIONS

This patent application is a National Stage Entry of PCT/CN2017/000043 filed on Jan. 3, 2017, which claims the benefit and priority of Chinese Patent Application No. 201620373112.6 filed on Apr. 27, 2016, the disclosures of which are incorporated by reference herein in their entirety as part of the present application.

BACKGROUND

The present disclosure relates to the field of display technologies, and more particularly, to a display device and a display terminal.

Liquid Crystal Display (LCD) has many advantages, such as low power consumption, small volume, light weight, ultra-thin screen and so on, and in recent years, has been widely used in digital products (such as multimedia players, digital cameras, or personal digital assistants), intelligent instruments and low-power consumption electronic products. Compared with the LCD display technology, Organic Light-Emitting Diode (OLED) technology has the characteristics of self-light-emitting. As can be used as a light source, the display using the OLED technology is very thin and very light, with a large screen viewing angle, and moreover can save electric energy. With the continuous advent of portable personal digital products, users may operate the display screens of various portable devices at any time and any place, and thus expect to protect their privacy while obtaining services.

BRIEF DESCRIPTION

Provided in the embodiments of the present disclosure are a display device and a display terminal, which can provide a peep-proof function so as to prevent the information on a display screen from being peeped and then prevent leakage of personal privacy.

A first aspect of the embodiments of the present disclosure provides a display device including a light emitting panel and at least one optical modulation unit provided on a light exit side of the light emitting panel, a grating layer being provided in the light emitting panel or between the light emitting panel and the optical modulation unit, wherein the optical modulation unit is configured to modulate incident light to exit at a certain preset angle, and the grating layer is configured to parallelize exit directions of incident light.

A second aspect of the embodiments of the present disclosure provides a display terminal including the display device according to the first aspect of the embodiments of the present disclosure.

According to an embodiment of the present disclosure, the optical modulation unit includes a first substrate, a second substrate, and a liquid crystal layer located between the first substrate and the second substrate, wherein at least one of the first substrate and the second substrate is provided with a plurality of groups of electrode structures thereon, respective groups of the electrode structures being configured to control liquid crystal molecules of corresponding regions in the liquid crystal layer to deflect to form a microprism structure, and the microprism structure is controlled to modulate incident light to exit at a certain preset angle by adjusting voltages of the respective groups of the electrode structures.

According to an embodiment of the present disclosure, the display device includes a plurality of sub-pixel regions arranged in an array, and the microprism structure corresponds to at least one sub-pixel region.

According to an embodiment of the present disclosure, the grating layer includes a first material layer, a second material layer, and a diffraction grating structure, the second material layer being provided on a light exit side of the diffraction grating structure and located between the diffraction grating structure and the first material layer, wherein a refractive index of the first material layer is higher than a refractive index of the second material layer.

According to an embodiment of the present disclosure, parameters of the diffraction grating structure are different for sub-pixel regions with different colors of the display device.

According to an embodiment of the present disclosure, the display device further includes a liquid crystal display panel which is provided between the light emitting panel and the optical modulation unit, wherein the grating layer is located in the light emitting panel, or between the grating layer and the optical modulation unit, wherein the light emitting panel is located on the other side of the grating layer with respect to the liquid crystal display panel, or between the grating layer and the light emitting panel, wherein the optical modulation unit is located on the other side of the grating layer with respect to the liquid crystal display panel.

According to an embodiment of the present disclosure, the light emitting panel includes an organic electroluminescent panel, and the organic electroluminescent panel at least includes a package substrate, a first electrode layer, a second electrode layer, and a light emitting layer located between the first electrode layer and the second electrode layer, wherein the grating layer is provided on a light exit side of the first electrode layer, and the package substrate is located on the other side of the grating layer with respect to the first electrode layer.

According to an embodiment of the present disclosure, the package substrate of the organic electroluminescent panel is used as an array substrate of the liquid crystal display panel.

According to an embodiment of the present disclosure, the organic electroluminescent panel further includes a first wire grid polarizer, wherein the first wire grid polarizer is provided on a light exit side of the package substrate, or between the package substrate and the grating layer, or between the grating layer and the first electrode layer.

According to an embodiment of the present disclosure, an upper polarizer is provided on a light exit side of the liquid crystal display panel, and a slit direction of the first wire grid polarizer is parallel to a transmission axis of the upper polarizer.

According to an embodiment of the present disclosure, the upper polarizer is a second wire grid polarizer.

According to an embodiment of the present disclosure, a slit direction of the second wire grid polarizer is perpendicular to the slit direction of the first wire grid polarizer.

According to an embodiment of the present disclosure, slit directions of the first wire grid polarizer are perpendicular to each other in adjacent sub-pixel regions, and/or slit directions of the second wire grid polarizer are perpendicular to each other in adjacent sub-pixel regions.

According to an embodiment of the present disclosure, the liquid crystal display panel may include a Twisted Nematic (TN) liquid crystal display panel, an Optically Compensated Bend (OCB) liquid crystal display panel, a Multi-domain Vertical Alignment (MVA) liquid crystal display panel, a Patterned Vertical Alignment (PVA) liquid crystal display panel, an InPlane Switching (IPS) liquid crystal display panel, or a Fringe Field Switching (FFS) liquid crystal display panel.

According to an embodiment of the present disclosure, the light emitting panel includes a top emission type organic electroluminescent panel or a bottom emission type organic electroluminescent panel.

The display device and the display terminal provided by the embodiments of the present disclosure can collimate exit light of the light emitting panel by providing the grating layer (such as a diffraction grating microstructure), and can control the direction of light in conjunction with the shaping effect on the light by the optical modulation unit, so as to implement the peep-proof application.

According to an embodiment of the present disclosure, the display device and the display terminal may adopt a structure in which the organic electroluminescent panel is combined with the liquid crystal display panel, wherein the organic electroluminescent panel controls the color to continuously emit light (constant voltage), and the liquid crystal display panel controls liquid crystals (for example, through the TFT substrate) to determine the grayscale, avoiding the residual image problem brought by the organic electroluminescent panel due to grayscale changes, meanwhile improving the life of the organic electroluminescent panel.

In addition, according to an embodiment of the present disclosure, a device can be made thinner overall by replacing the traditional polarizer in the conventional liquid crystal display panel with a Wire Grid Polarizer (WGP). Since the metal layer of the wire grid polarizer has a certain reflectivity, the light extraction efficiency of the organic electroluminescent panel can be improved.

BRIEF DESCRIPTION OF THE DRAWINGS

In order to more clearly illustrate the technical solutions of the embodiments of the present disclosure, the accompanying drawings of exemplary embodiments will be briefly described below. Apparently, the accompanying drawings described below are exemplary and illustrative only and are not intended to limit the present disclosure in any way. Those of ordinary skill in the art may obtain other drawings from these drawings. Various aspects and their further objects and advantages of the embodiments of the present disclosure will be better understood by reference to the following detailed description of illustrative embodiments when reading in conjunction with the accompanying drawings in which:

FIG. 8 is a schematic cross-sectional diagram of a display device provided according to at least one embodiment of the present disclosure; and FIGS. 9A-9D are schematic diagrams of the pattern of wire grid polarizers according to at least one embodiment of the present disclosure.

DETAILED DESCRIPTION

In order to make the technical solutions and advantages of the embodiments of the present disclosure more clear, the embodiments of the present disclosure will be described below in detail with reference to the accompanying drawings. Apparently, the described embodiments are merely part but not all of the embodiments of the present disclosure. All other embodiments obtained by those of ordinary skill in the art based on the embodiments of the present disclosure without the need for creative labor are also within the scope of protection of the present disclosure.

Throughout this specification, the phrasing concerning the features, advantages, and the like does not mean that all features and advantages that may be practiced with the present disclosure should be or intended to be in any single embodiment of the present disclosure. Rather, it is to be understood that the phrasing concerning the features and advantages means that the specific features, advantages or characteristics described in conjunction with the embodiments are included in at least one embodiment of the present disclosure. Thus, throughout the specification, the discussion of features, advantages and similar phrasing may refer to the same embodiment, but may not necessarily refer to the same embodiment. In addition, the described features, advantages and characteristics of the present disclosure may be incorporated in one or more embodiments in any suitable manner. Those skilled in the relevant art will recognize that the present disclosure may be practiced without one or more specific features or advantages of a particular embodiment. In other examples, additional features and advantages may be implemented in certain embodiments, which are not necessarily present in all the embodiments of the present disclosure.

Figure 1:
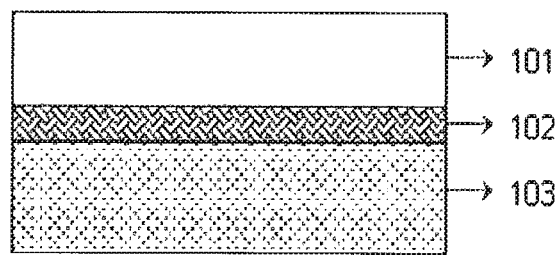
FIG. 1 is a schematic cross-sectional diagram of a display device provided according to at least one embodiment of the present disclosure.

FIG. 1 is a schematic cross-sectional diagram of a display device provided according to at least one embodiment of the present disclosure. The display device provided by the embodiment of the present disclosure may include a light emitting panel 103 and at least one optical modulation unit 101 provided on a light exit side of the light emitting panel 103. As shown in FIG. 1, a grating layer 102 is provided between the light emitting panel 103 and the optical modulation unit 101. Alternatively, the grating layer 102 may be provided in the light emitting panel 103 as described later in conjunction with FIG. 5 to FIG. 8. According to the embodiment of the present disclosure, the optical modulating unit 101 is configured to modulate incident light to exit at a preset angle, and the grating layer 102 is configured to parallelize exit directions of incident light.

For example, the grating layer 102 may have a selective and corrective effect on the light from the light emitting panel 103, so that the incident light of the optical modulation unit 101 become substantially parallel light beams. The optical modulation unit 101 may further adjust directions of the parallel beams, so that the light exits at a preset specific angle, thereby achieving the peep-proof effect.

Figure 2:
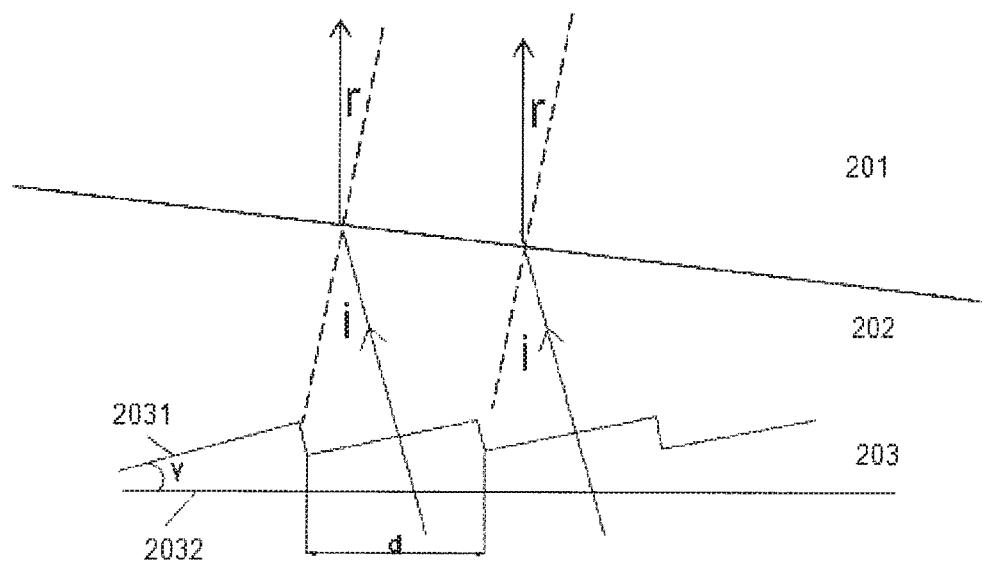
FIG. 2 is a schematic diagram of a grating layer provided according to at least one embodiment of the present disclosure.

FIG. 2 is a schematic diagram of a grating layer provided according to at least one embodiment of the present disclosure. As shown in FIG. 2, the grating layer 102 according to the embodiment of the present disclosure may include a first material layer 201, a second material layer 202, and a diffraction grating structure 203, the second material layer 202 being provided on a light exit side of the diffraction grating structure 203 and being located between the diffraction grating structure 203 and the first material layer 201, wherein the refractive index of the first material layer 201 is higher than the refractive index of the second material layer 202.

According to an embodiment of the present disclosure, the diffraction grating structure 203 may include a groove surface 2031 and a grating surface 2032. When the incident light is perpendicular to the groove surface 2031 and a condition of 2d*sin γ=λ is satisfied, the light beam having a wavelength λ is intensified at a specific angle to form the exit light, where d is the grating period or pitch, γ is the grating groove angle, λ is the wavelength of the incident light. For example, corresponding to the sub-pixel regions of different colors (such as R, G, B) of the display device provided by the embodiment of the present disclosure, the parameters (such as d and γ) of the diffraction grating structure 203 may be different. Thus, different light exit angles and different light exit bands can be obtained by designing different d and γ values to apply to the sub-pixel regions with corresponding colors.

In other words, the diffraction grating structure 203 according to the embodiment of the present disclosure has a selective effect on the incident light, which enables the exit light of the sub-pixel regions of different colors to be a group of parallel beams perpendicular to the corresponding groove face 2031, respectively, and on the whole, it can be seen that the light passing through the diffraction grating structure 203 can be parallel to each other. On the other hand, although the light passing through the diffraction grating structure 203 is parallel to each other, the directions thereof might be inclined, and therefore the light may also be adjusted to be emitted vertically upward as necessary.

According to an embodiment of the present disclosure, the first material layer 201 and the second material layer 202 may be provided on the diffraction grating structure 203, whereby the grating layer 102 is implemented by a diffraction grating microstructure as shown in FIG. 2. For example, the first material layer 201 may be bonded to the second material layer 202, and the bonding surface may be inclined. As shown in FIG. 2, since the refractive index n1 of the first material layer 201 is greater than the refractive index n2 of the second material layer 202, the exit angle r is smaller than the incident angle i according to the refractive law i*sin n2=r*sin n1, so that the exit light converges to the center, resulting in vertical upward collimated light.

Thus, according to the embodiment of the present disclosure, the grating layer 102 such as the diffraction grating microstructure shown in FIG. 2 is provided in the light emitting panel 103 or between the light emitting panel 103 and the optical modulation unit 101, and the exit light of the light emitting panel 103 may be collimated by making exit directions of the incident light in parallel. Further, the optical modulation unit 101 according to the embodiment of the present disclosure may be configured to perform left and right (in a horizontal direction) adjustments or up and down (in a vertical direction) adjustments on the travelling direction of the collimated exit light of the light emitting panel 103, thereby implementing the peep-proof application by controlling the direction of the light.

Figure 3A:
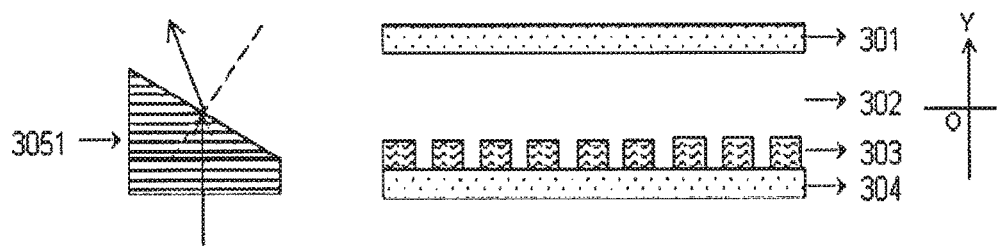
FIGS. 3A and 3B are schematic diagrams of an exemplary equivalent optical device of an optical modulating unit provided according to at least one embodiment of the present disclosure.
Figure 3B:
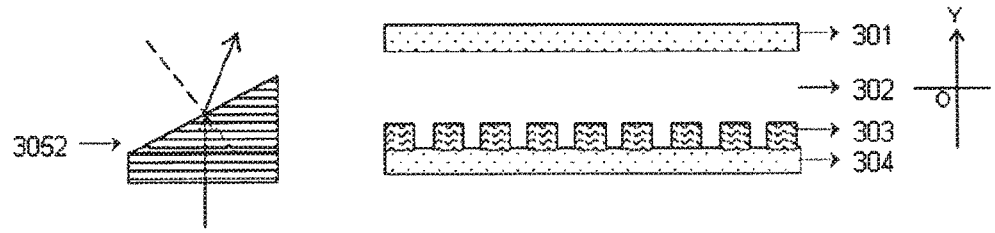

FIGS. 3A-3B are schematic diagrams of an exemplary equivalent optical device of an optical modulating unit provided according to at least one embodiment of the present disclosure. As shown in FIGS. 3A-3B, the optical modulation unit 101 according to the embodiment of the present disclosure may include a first substrate 301, a second substrate 304, and a liquid crystal layer 302 located between the first substrate 301 and the second substrate 304. For example, a plurality of groups of electrode structures 303 may be provided on the first substrate 301 and/or the second substrate 304, respective groups of the electrode structures 303 are configured to control liquid crystal molecules of the corresponding regions in the liquid crystal layer 302 to deflect to form a microprism structure 3051 or 3052, and by adjusting the voltages of the respective groups of the electrode structures 303, the microprism structure 3051 or 3052 may be controlled to modulate incident light to exit at a certain preset angle.

For the purpose of illustration, FIGS. 3A-3B also show an XOY reference plane defined by an X-axis, a Y-axis, and an origin O, where the cross-section of the display device shown in FIG. 1 is in parallel to the XOY reference plane. As shown in FIG. 3A, when the voltages of the electrode structures 303 are controlled to be sequentially raised up in the positive direction of the X-axis (for example, increasing progressively according to values of an arithmetic series), the formed microprism structure 3051 can control the travelling direction of the exit light to be shifted to the left (toward the lower voltage direction) with respect to the incident light. Similarly, as shown in FIG. 3B, when the voltages of the electrode structures 303 are controlled to descend sequentially in the positive direction of the X-axis (for example, decreasing progressively according to values of an arithmetic series), the formed microprism structure 3052 can control the travelling direction of the exit light to be shifted to the right (toward the lower voltage direction) with respect to the incident light. Therefore, with the optical modulation unit shown in FIGS. 3A-3B, the incident light can be modulated in the horizontal direction (for example, along the X-axis direction).

Alternatively or additionally, the optical modulation unit 101 may also modulate the incident light in a vertical direction (for example, along the direction perpendicular to the XOY reference plane). In this case, the plurality of groups of electrode structures 303 are provided on the first substrate 301 and/or the second substrate 304 of the optical modulation unit 101 along the direction perpendicular to the XOY reference plane. Similar to the structure as shown in FIGS. 3A-3B, by controlling the voltage levels of respective groups of electrode structures 303, the microprism structure formed in the liquid crystal layer 302 can control the travelling direction of the exit light to be shifted upward or downward (for example, in the direction perpendicular to the XOY reference plane) with respect to the incident light.

Thus it can be seen that the direction of the exit light of the display device of the embodiment of the present disclosure can be controlled by applying at least one optical modulation unit 101, so that the modulated light can exit at a preset angle (for example, perpendicular to the surface of the optical modulation unit 101). It should be understood that FIGS. 3A-3B merely exemplarily illustrate an equivalent optical device of the optical modulation unit implemented according to a liquid crystal cell structure, and those of ordinary skill in the art, without creative work, can conceive of other equivalent structures or variants for implementing the optical modulation unit according to the embodiments of the present disclosure on the basis of the structures shown in FIGS. 3A-3B. For example, the optical modulation unit 101 according to the embodiment of the present disclosure may also be implemented as any other suitable optical device structure having an optical modulation function (such as a light direction adjustment function).

Figure 4:
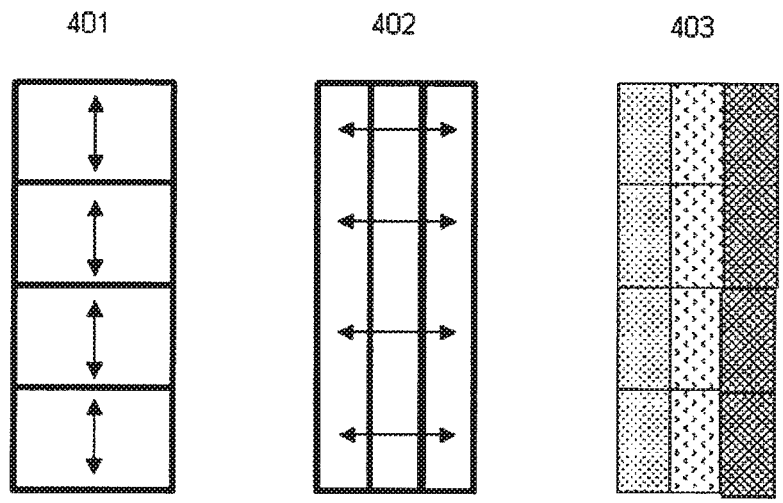
FIG. 4 is a schematic diagram of the relationship between the optical modulation unit and sub-pixel regions of the display device provided according to at least one embodiment of the present disclosure.

FIG. 4 is a schematic diagram of the relationship between the optical modulation unit and sub-pixel regions of the display device provided according to at least one embodiment of the present disclosure. The display device provided according to the embodiment of the present disclosure may include a plurality of sub-pixel regions arranged in an array, and the microprism structure formed by the optical modulation unit 101 may correspond to at least one sub-pixel region. For example, the plurality of sub-pixel regions arranged in an array may include three sub-pixel regions 403 (for example, R, G, B sub-pixel regions from right to left, respectively) as shown in FIG. 4, where each column of sub-pixel regions may correspond to one microprism structure, and accordingly, three microprism structures of the optical modulation unit 402 are schematically shown in three boxes in FIG. 4 for horizontal modulation of the light direction (as shown by the horizontal bidirectional arrows in FIG. 4). Similarly, the sub-pixel regions 403 in FIG. 4 include four rows of sub-pixel regions (each row having three sub-pixel regions R, G, B), where each row of sub-pixel regions may correspond to one microprise structure, and accordingly, four microprism structures of the optical modulation unit 401 are schematically shown in four boxes in FIG. 4 for vertical modulation of the light direction (as indicated by the vertical bidirectional arrows in FIG. 4).

The display device according to the embodiment of the present disclosure may further include a liquid crystal display panel. The liquid crystal display panel may include a TN liquid crystal display panel, an OCB liquid crystal display panel, an MVA liquid crystal display panel, a PVA liquid crystal display panel, an IPS liquid crystal display panel, or an FFS liquid crystal display panel.

In an embodiment of the present disclosure, the liquid crystal display panel may be provided between the light emitting panel 103 and the optical modulation unit 101, wherein the grating layer 102 is located in the light emitting panel 103 (as shown in FIGS. 5-8). In another embodiment of the present disclosure, the liquid crystal display panel may be provided between the grating layer 102 and the optical modulation unit 101, wherein the light emitting panel 103 is located on the other side of the grating layer 102 with respect to the liquid crystal display panel. In yet another embodiment of the present disclosure, the liquid crystal display panel may be provided between the grating layer 102 and the light emitting panel 103, wherein the optical modulation unit 101 is located on the other side of the grating layer 102 with respect to the liquid crystal display panel.

Figure 5:
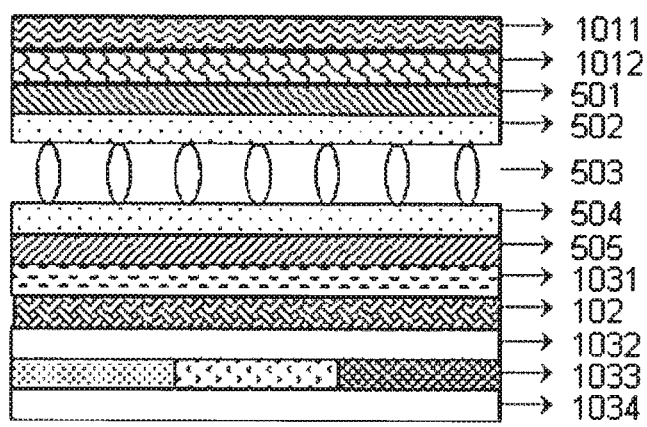
FIG. 5 is a schematic cross-sectional diagram of a display device provided according to at least one embodiment of the present disclosure.

FIG. 5 is a schematic cross-sectional diagram of a display device provided according to at least one embodiment of the present disclosure. The display device shown in FIG. 5 includes optical modulation units 1011 and 1012, a liquid crystal display panel, a light emitting panel, and a grating layer 102 provided in the light emitting panel. The liquid crystal display panel shown in FIG. 5 includes an upper polarizer (POL) 501, a matrix substrate (such as a color film substrate without a RGB color barrier layer, or a black matrix substrate without color filter) 502, a liquid crystal layer 503, an array substrate (such as a TFT substrate) 504, and a lower polarizer 505.

At present, OLED is becoming more mature, but in view of its service life and reliability (such as residual image) problems and the advantages of LCD in these aspects, the two can be combined to produce a new display technology. The light emitting panel 103 according to the embodiment of the present disclosure may include an organic electroluminescent panel. The liquid crystal display panel and the organic electroluminescent panel may be glued by Optical Clear Adhesive (OCA).

The organic electroluminescent panel as shown in FIG. 5 at least includes a package substrate 1031, a first electrode layer (for example, a cathode layer or an anode layer) 1032, a second electrode layer (for example, an anode layer or a cathode layer) 1034, and a light emitting layer 1033 located between the first electrode layer 1032 and the second electrode layer 1034. For example, the second electrode layer 1034 may be implemented on an electrode substrate. In an embodiment of the present disclosure, the grating layer 102 may be provided on the light exit side of the first electrode layer 1032, and the package substrate 1031 may be located on the other side of the grating layer 102 with respect to the first electrode layer 1032.

The light emitting panel 103 according to the embodiment of the present disclosure may include a top emission type organic electroluminescent panel or a bottom emission type organic electroluminescent panel. It will be understood that the first electrode layer 1032 shown in FIG. 5 is a cathode layer and the second electrode layer 1034 may be implemented as an anode substrate in the case of the top emission type organic electroluminescent panel, accordingly, in the case of the bottom emission type organic electroluminescent panel, the first electrode layer 1032 is an anode layer and the second electrode layer 1034 may be implemented as a cathode substrate.

In the display device shown in FIG. 5, the organic electroluminescent panel can continuously emit light (at a fixed voltage) to control the color, and the liquid crystal display panel (for example, using the TFT substrate) can control the liquid crystal layer 503 to determine the transmittance (i.e. luminance), thereby avoiding the residual image problem brought by the organic electroluminescent panel due to grayscale changes, meanwhile improving the life of the organic electroluminescent panel.

According to an embodiment of the present disclosure, the grating layer 102 can parallelize the exit light of the light emitting panel and correct it as the collimated light, as described in conjunction with FIG. 2. Further, as described in conjunction with FIGS. 3A-3B, one of the optical modulation units 1011 and 1012 may be configured to horizontally modulate the light direction and the other to vertically modulate the light direction, so that the light exits in a preset specific direction (for example, substantially perpendicular to the surface of the display device), thereby implementing the peep-proof function of the display device.

Figure 6:
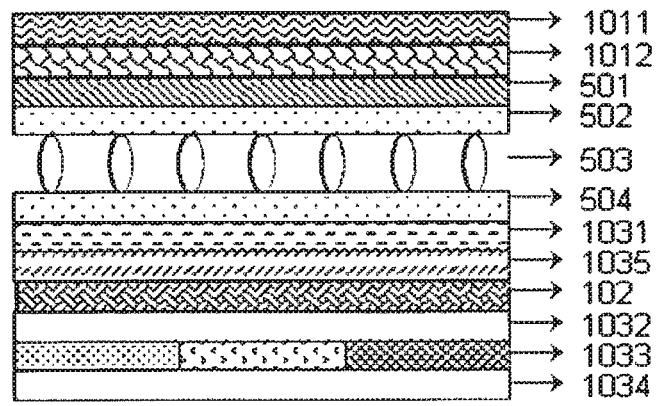
FIG. 6 is a schematic cross-sectional diagram of a display device provided according to at least one embodiment of the present disclosure.

FIG. 6 is a schematic cross-sectional diagram of a display device provided according to at least one embodiment of the present disclosure. Similar to FIG. 5, the display device as shown in FIG. 6 includes optical modulation units 1011 and 1012, a liquid crystal display panel, an organic electroluminescent panel, and a grating layer 102 provided in the organic electroluminescent panel. Unlike the display device shown in FIG. 5, the display device shown in FIG. 6 employs a wire grid polarizer (WGP) to replace the conventional lower polarizer 505, and in particular, as a lower polarizer corresponding to the upper polarizer 501 of the liquid crystal display panel, the wire grid polarizer (such as a first wire grid polarizer 1035 shown in FIG. 6) is provided in the organic electroluminescent panel.

In this regard, the organic electroluminescent panel according to the embodiments of the present disclosure may further include the first wire grid polarizer 1035. For example, the first wire grid polarizer 1035 may be provided on the light exit side of the package substrate 1031 or between the package substrate 1031 and the grating layer 102 (as shown in FIG. 6), or may be provided between the grating layer 102 and the first electrode layer 1032. The slit direction of the first wire grid polarizer 1035 is parallel to the transmission axis of the upper polarizer 501 provided on the light exit side of the liquid crystal display panel.

According to an embodiment of the present disclosure, a nano-imprinting technique may be employed, for example, to provide the first wire grid polarizer according to any one of the following ways: preparing the first wire grid polarizer on the first electrode layer of the organic electroluminescent panel, preparing the first wire grid polarizer on the package substrate glass of the organic electroluminescent panel, and then packaging the organic electroluminescent panel, and preparing the first wire grid polarizer on the package substrate glass of the already-packaged organic electroluminescent panel. Thus, the lower polarizer of the original liquid crystal display panel can be replaced by an In-cell structure of the wire grid polarizer.

Since the metal layer (of which the material is usually aluminum) of the wire grid polarizer has a certain reflectivity (generally 30%), compared with the conventional polarizer, it is possible to reflect the light that cannot be transmitted back for reuse, thereby improving the light extraction efficiency of the organic electroluminescent panel. In addition, the conventional polarizer used in the liquid crystal display panel is not only thick, but also has poor reliability, easily causing curls and polarization failures in a high temperature and high humidity environment, whereas the metal material of the wire grid polarizer itself has good reliability. Further, considering that the thickness of the metal layer of the wire grid polarizer is usually on the nanometer scale (e.g., 150 nm) while the thickness of the conventional polarizer is on the micrometer scale (e.g., 120 μm), the overall device thickness of the display device according to the embodiments of the present disclosure can be reduced.

Figure 7:
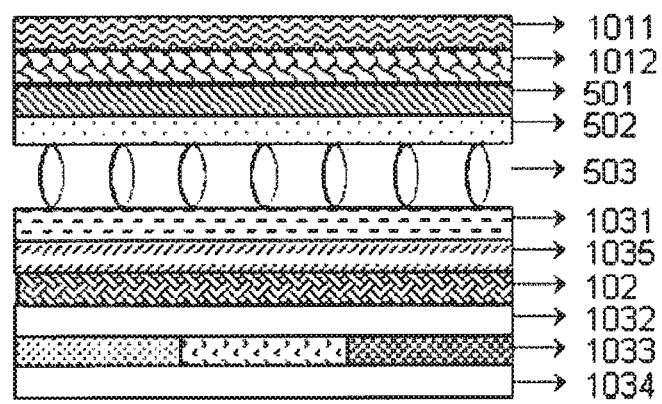
FIG. 7 is a schematic cross-sectional diagram of a display device provided according to at least one embodiment of the present disclosure.

FIG. 7 is a schematic cross-sectional diagram of a display device provided according to at least one embodiment of the present disclosure. Similar to FIG. 5 and FIG. 6, the display device as shown in FIG. 7 includes optical modulation units 1011 and 1012, a liquid crystal display panel, an organic electroluminescent panel, and a grating layer 102 provided in the organic electroluminescent panel. In particular, in this exemplary embodiment, the package substrate 1031 of the organic electroluminescent panel is used as the array substrate 504 of the liquid crystal display panel.

In this regard, the liquid crystal display panel shown in FIG. 7 is not provided with the array substrate 504 (for example, the TFT substrate) shown in FIG. 5 or FIG. 6, rather the package substrate 1031 of the organic electroluminescent panel is prepared as a package substrate having a TFT layer, so that the package substrate 1031 of the organic electroluminescent panel can be used as the TFT substrate of the liquid crystal display panel. For example, the TFT layer of the liquid crystal display panel may be prepared first with respect to the package substrate glass of the organic electroluminescent panel, and then the organic electroluminescent panel may be packaged. The display device provided by the embodiment of the present disclosure can save at least one layer of glass (for example, saving the TFT substrate glass) in structure, thereby simplifying the manufacturing process and saving the cost.

FIG. 8 is a schematic cross-sectional diagram of a display device provided according to at least one embodiment of the present disclosure. Similar to FIG. 5 and FIG. 6, the display device as shown in FIG. 8 includes optical modulation units 1011 and 1012, a liquid crystal display panel, an organic electroluminescent panel, and a grating layer 102 provided in the organic electroluminescent panel. In particular, in this exemplary embodiment, the upper polarizer of the liquid crystal display panel is a second wire grid polarizer 801. The slit direction of the second wire grid polarizer 801 is perpendicular to the slit direction of the first wire grid polarizer 1035.

Corresponding to the first wire grid polarizer 1035 in the organic electroluminescent panel, by using the second wire grid polarizer 801 to further replace the conventional upper polarizer in the liquid crystal display panel, the double-sided WGP structure of the liquid crystal display panel can be implemented, so that the overall thickness of the display device is further reduced. In addition, by using the first and second wire grid polarizers that correspond to each other, the patterned design of the wire grid polarizers can be used in cooperation with the view image to obtain a 3D display effect.

FIGS. 9A-9D are schematic diagrams of the pattern of wire grid polarizers according to at least one embodiment of the present disclosure. According to this exemplary embodiment, the slit directions of the first wire grid polarizer 1035 are perpendicular to each other in adjacent sub-pixel regions, and/or the slit directions of the second wire grid polarizer 801 are perpendicular to each other in adjacent sub-pixel regions. For example, the pattern of the first wire grid polarizer 1035 and the second wire grid polarizer 801 may be implemented according to the schematic views depicted in FIGS. 9A and 9B, respectively. Alternatively, the pattern of the first wire grid polarizer 1035 and the second wire grid polarizer 801 may be implemented according to the schematic views depicted in FIGS. 9C and 9D, respectively. The 3D display application of the display device according to the embodiments of the present disclosure can be implemented by patterning the wire grid polarizers and then cooperating with the corresponding views.

It should be understood that FIG. 1 to FIG. 9D merely schematically show exemplary structures according to the embodiments of the present disclosure, and that those of ordinary skill in the art can conceive of, upon actual practice and application and according to the teachings provided in this specification, various equivalent structures or variations of the display device of the embodiments of the present disclosure. For example, the light emitting panel and/or the liquid crystal display panel may have more or fewer structural layers and/or device units, and may be implemented with different types and/or modes of components when necessary. In addition, although the grating layer 102 is shown in a light emitting panel such as an organic electroluminescent panel as shown in FIGS. 5-8, it would be understood that the grating layer provided by the embodiments of present disclosure may also be provided outside the light emitting panel, and the wire grid polarizer still can be used to replace the conventional polarizer.

According to the embodiments of the present disclosure, by providing the grating layer (such as the diffraction grating microstructure as shown in FIG. 2) in the display device, the light emitted from the light emitting panel can be collimated, and by cooperatively using at least one optical modulation unit, the light exit direction can be controlled, so as to implement the peep-proof application. In addition, in conjunction with the patterned design of the wire grid polarizer, the embodiments of the present disclosure may further provide a multifunctional display device incorporating 3D and peep-proof performance.

The embodiments of the present disclosure further provide a display terminal including the display device provided according to any of the preceding exemplary embodiments. The display terminal may include any mobile terminal, fixed terminal or portable terminal having a display function, including, but not limited to, a mobile phone, a smartphone, a multimedia device, a desktop computer, a laptop computer, a tablet computer, a personal communication system device, a personal navigation device, a personal digital assistant, an audio player, a video player, a digital camera, a digital video camera, a positioning device, a television receiver, a radio broadcasting receiver, an electronic book device, a game device, a wearable device, a medical equipment, and/or the like.

Benefiting from the teaching presented in the foregoing description and associated drawings, those of ordinary skill in the art to which this disclosure pertains will conceive of many modifications and other embodiments of the present disclosure set forth herein. It is therefore to be understood that the present disclosure is not limited to the specific embodiments disclosed, and such modifications and other embodiments are intended to be covered within the scope of the appended claims.

What is claimed is:

1. A display device comprising:
a light emitting panel; and
at least one optical modulation unit provided on a light exit side of the light emitting panel, wherein a grating layer is provided in i) the light emitting panel or ii) between the light emitting panel and the optical modulation unit, wherein the optical modulation unit is configured to modulate incident light to exit at a certain preset angle, and wherein the grating layer is configured to parallelize exit directions of incident light.

2. The display device according to claim 1, wherein the at least one optical modulation unit comprises a first substrate, a second substrate, and a liquid crystal layer located between the first substrate and the second substrate, wherein at least one of the first substrate and the second substrate is provided with a plurality of groups of electrode structures thereon, wherein respective groups of the electrode structures are configured to control liquid crystal molecules of corresponding regions in the liquid crystal layer to deflect to form a microprism structure, and wherein the microprism structure is controlled to modulate incident light to exit at a certain preset angle by adjusting voltages of the respective groups of the electrode structures.

3. The display device according to claim 2, wherein the display device comprises a plurality of sub-pixel regions arranged in an array, and wherein the microprism structure corresponds to at least one sub-pixel region.

4. The display device according to claim 1, wherein the grating layer comprises a first material layer, a second material layer, and a diffraction grating structure, wherein the second material layer is provided on a light exit side of the diffraction grating structure and located between the diffraction grating structure and the first material layer, and wherein a refractive index of the first material layer is higher than a refractive index of the second material layer.

5. The display device according to claim 4, wherein parameters of the diffraction grating structure are different for sub-pixel regions with different colors of the display device.

6. The display device according to claim 1, wherein the display device further comprises a liquid crystal display panel which is provided:
between the light emitting panel and the optical modulation unit, wherein the grating layer is located in the light emitting panel; or
between the grating layer and the optical modulation unit, wherein the light emitting panel is located on the other side of the grating layer with respect to the liquid crystal display panel; or
between the grating layer and the light emitting panel, wherein the optical modulation unit is located on the other side of the grating layer with respect to the liquid crystal display panel.

7. The display device according to claim 6, wherein the light emitting panel comprises an organic electroluminescent panel, and wherein the organic electroluminescent panel at least comprises a package substrate, a first electrode layer, a second electrode layer, and a light emitting layer located between the first electrode layer and the second electrode layer, wherein the grating layer is on a light exit side of the first electrode layer, and wherein the package substrate is located on the other side of the grating layer with respect to the first electrode layer.

8. The display device according to claim 7, wherein the package substrate of the organic electroluminescent panel is used as an array substrate of the liquid crystal display panel.

9. The display device according to claim 7, wherein the organic electroluminescent panel further comprises a first wire grid polarizer, and wherein the first wire grid polarizer is provided:
on a light exit side of the package substrate; or
between the package substrate and the grating layer; or
between the grating layer and the first electrode layer.

10. The display device according to claim 9, wherein an upper polarizer is provided on a light exit side of the liquid crystal display panel, and wherein a slit direction of the first wire grid polarizer is parallel to a transmission axis of the upper polarizer.

11. The display device according to claim 10, wherein the upper polarizer is a second wire grid polarizer.

12. The display device according to claim 11, wherein a slit direction of the second wire grid polarizer is perpendicular to the slit direction of the first wire grid polarizer.

13. The display device according to claim 6, wherein the liquid crystal display panel comprises a twisted nematic liquid crystal display panel, an optically compensated bend liquid crystal display panel, a multi-domain vertical alignment liquid crystal display panel, a patterned vertical alignment liquid crystal display panel, an inplane switching liquid crystal display panel, or a fringe field switching liquid crystal display panel.

14. The display device according to claim 1, wherein the light emitting panel comprises a top emission type organic electroluminescent panel or a bottom emission type organic electroluminescent panel.

15. A display terminal, comprising the display device according to claim 1.

16. The display device according to claim 2, wherein the grating layer comprises a first material layer, a second material layer, and a diffraction grating structure, wherein the second material layer is provided on a light exit side of the diffraction grating structure and located between the diffraction grating structure and the first material layer, and wherein a refractive index of the first material layer is higher than a refractive index of the second material layer.

17. The display device according to claim 3, wherein the grating layer comprises a first material layer, a second material layer, and a diffraction grating structure, wherein the second material layer is provided on a light exit side of the diffraction grating structure and located between the diffraction grating structure and the first material layer, and wherein a refractive index of the first material layer is higher than a refractive index of the second material layer.

18. The display device according to claim 2, wherein the display device further comprises a liquid crystal display panel which is provided:
- between the light emitting panel and the optical modulation unit, wherein the grating layer is located in the light emitting panel; or
- between the grating layer and the optical modulation unit, wherein the light emitting panel is located on the other side of the grating layer with respect to the liquid crystal display panel; or
- between the grating layer and the light emitting panel, wherein the optical modulation unit is located on the other side of the grating layer with respect to the liquid crystal display panel.

19. The display device according to claim 3, wherein the display device further comprises a liquid crystal display panel which is provided:
- between the light emitting panel and the optical modulation unit, wherein the grating layer is located in the light emitting panel; or
- between the grating layer and the optical modulation unit, wherein the light emitting panel is located on the other side of the grating layer with respect to the liquid crystal display panel; or
- between the grating layer and the light emitting panel, wherein the optical modulation unit is located on the other side of the grating layer with respect to the liquid crystal display panel.

20. The display device according to claim 5, wherein the display device further comprises a liquid crystal display panel which is provided:
- between the light emitting panel and the optical modulation unit, wherein the grating layer is located in the light emitting panel; or
- between the grating layer and the optical modulation unit, wherein the light emitting panel is located on the other side of the grating layer with respect to the liquid crystal display panel; or
- between the grating layer and the light emitting panel, wherein the optical modulation unit is located on the other side of the grating layer with respect to the liquid crystal display panel.

* * * * *